United States Patent [19]

Singh

[11] Patent Number: 5,309,063
[45] Date of Patent: May 3, 1994

[54] INDUCTIVE COIL FOR INDUCTIVELY COUPLED PLASMA PRODUCTION APPARATUS

[75] Inventor: Bawa Singh, Vorhees, N.J.

[73] Assignee: David Sarnoff Research Center, Inc., Princeton, N.J.

[21] Appl. No.: 26,400

[22] Filed: Mar. 4, 1993

[51] Int. Cl.⁵ .............................................. H01J 7/24
[52] U.S. Cl. ...................... 315/111.51; 315/111.41; 315/111.21; 315/267; 315/344; 219/121.51; 118/723 R
[58] Field of Search ............ 315/111.51, 111.41, 315/111.21, 267, 344; 219/121.51; 118/723

[56] References Cited

U.S. PATENT DOCUMENTS

| | | | |
|---|---|---|---|
| 2,015,885 | 10/1935 | Dallenbach | 176/124 |
| 3,384,773 | 3/1968 | Kauer | 313/222 |
| 3,546,522 | 12/1970 | Thorpe | 313/231 |
| 4,206,387 | 6/1980 | Kramer et al. | 315/344 |
| 4,836,140 | 6/1989 | Koji | 118/722 |
| 4,844,775 | 7/1989 | Keeble | 156/643 |
| 4,894,589 | 1/1990 | Borowiec | 315/248 |
| 4,948,458 | 8/1990 | Ogle | 156/643 |
| 4,982,140 | 1/1991 | Witting | 315/248 |
| 5,007,373 | 4/1991 | Legg et al. | 118/723 |
| 5,047,693 | 9/1991 | Roberts | 315/344 |
| 5,140,227 | 8/1992 | Dakin et al. | 315/248 |
| 5,162,699 | 11/1992 | Tokoro et al. | 315/111.41 |

Primary Examiner—Robert J. Pascal
Assistant Examiner—Reginald A. Ratliff
Attorney, Agent, or Firm—William J. Burke

[57] ABSTRACT

The invention is directed to an induction coil which includes a flat spirally wound portion and a tubular spirally wound portion extending from the outer edge of the flat portion. The axis of the tubular portion is substantially perpendicular to the flat portion. The coil is useful in a plasma production apparatus which includes a chamber having walls and adapted to be evacuated. A window extends into the chamber from one of the walls. The coil is in the window with the flat portion being at the bottom of the window.

16 Claims, 4 Drawing Sheets

INDUCTIVE COIL FOR INDUCTIVELY COUPLED PLASMA PRODUCTION APPARATUS

The invention relates to an inductive coil, and, more particularly, to an inductive coil for an inductively coupled plasma production apparatus.

BACKGROUND OF THE INVENTION

Plasma system have come into use in the processing of semiconductor materials. Inductively coupled system are increasingly being employed for producing the plasma in such systems. One type of inductive coil being used in such inductively coupled systems is a flat or pancake coil such as shown in U.S. Pat. No. 4,948,458. The flat coil is mounted externally of the vacuum chamber in which the plasma is generated and is inductively coupled into the plasma through an insulating window. Although this coil configuration has a number of attractive features, including simplicity of design, it also has a number of limitations. One limitation is that it requires an insulating window to allow the RF. field to pass therethrough into the vacuum chamber. A second limitation is that the radial plasma density profile, in the plane of the coil, produced by a flat coil is relatively non-uniform. Such a window can be expensive to manufacture and is subject to being damaged by the plasma. Also, the inductive coupling provided by the flat coil has two components, a capacitive (E) field component and the inductive (H or B) field component. This is undesirable since it is only the inductive component that is desired. Furthermore, with the flat coil, the plasma density drops off rapidly away from the window.

SUMMARY OF THE INVENTION

The invention is directed to an inductive coil having a planar coil portion and a tubular coil portion extending from the outer edge of the flat coil portion. The axis of the tubular coil portion is substantially perpendicular to the flat coil portion.

The invention is also directed to a plasma production apparatus which includes a chamber having walls and adapted to be placed under a vacuum. An electrode is in the chamber, and a window extends into the chamber from a wall thereof. An induction coil is in the well formed by the window. The induction coil has a flat portion at the bottom of the window and a tubular portion extending from the flat portion.

DETAILED DESCRIPTION

Figure 1:
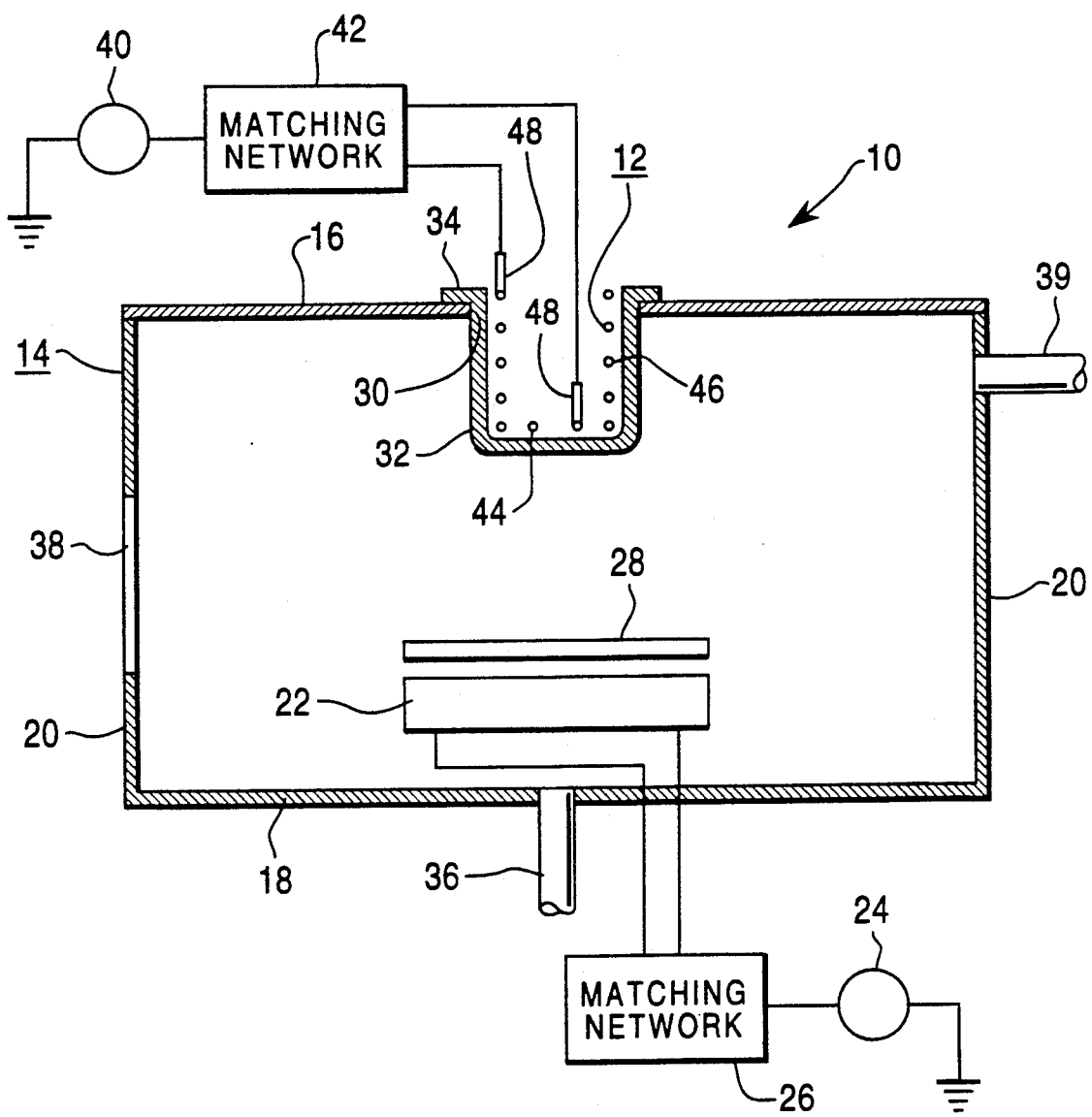
FIG. 1 is a schematic view of one form of a plasma generating apparatus having the inductive coil of the invention.
Figure 2:
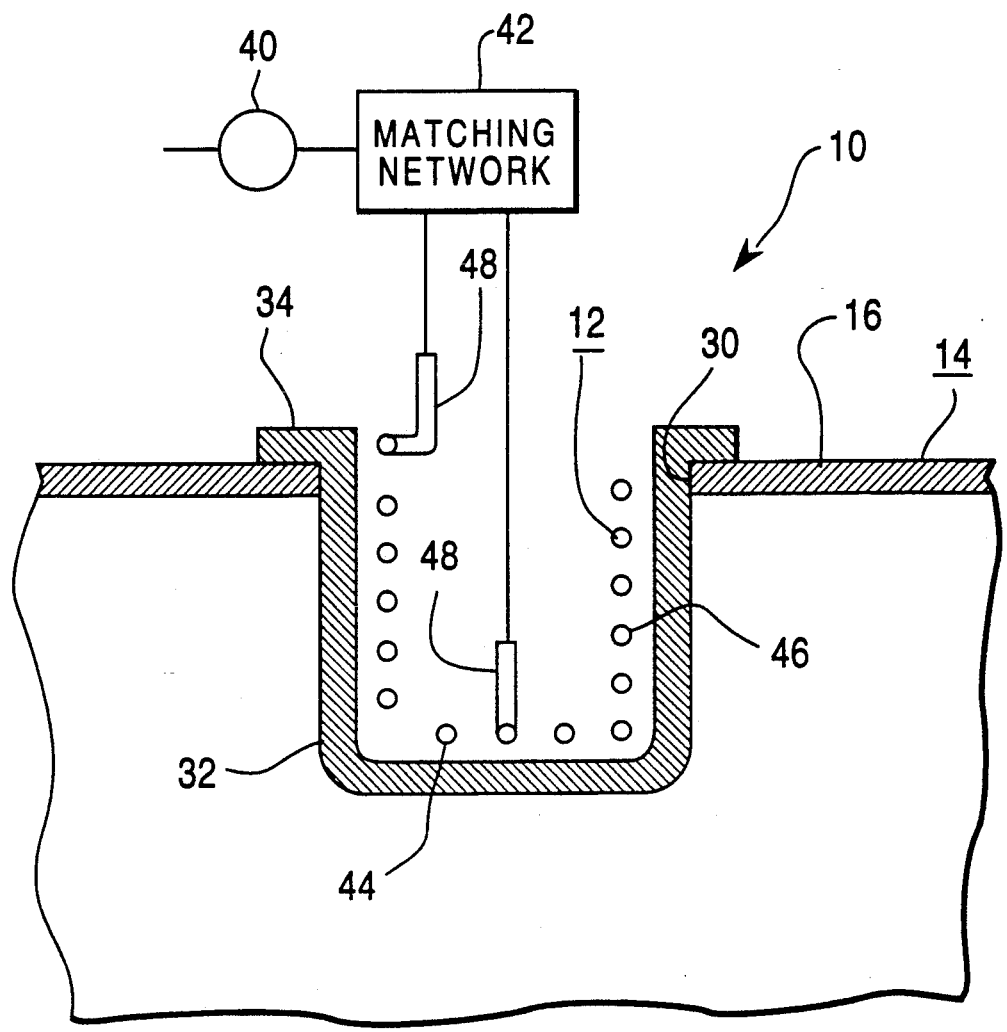
FIG. 2 is an enlarged view of a portion of the apparatus shown in FIG. 1.

Referring initially to FIG. 1, there is shown a plasma generating apparatus 10 having the inductive coil 12 of the invention. Plasma generating apparatus 10 comprises a chamber 14 in which there can be generated a vacuum. The chamber 14 has top and bottom walls 16 and 18, and side walls 20. Within the chamber 14 and adjacent the bottom wall 18 is an electrode 22. The electrode 22 is electrically connected to an RF power supply 24 outside the chamber through a matching network circuit 26. On the electrode 22 is a table 28 for supporting an object, such as a semiconductor wafer, which is to be treated in the plasma. The top wall 16 has an opening 30 therethrough. In FIG. 2, window 32, preferably cup-shaped, extends through the opening 30 and into the chamber 14. The window 32 has a rim 34 around its upper edge which seats on and is hermetically sealed to the top wall 16 around the opening 30. The window 32 may be of an insulating material, a conductive material or an insulating material coated on its outer surface with a layer of a conductive material. The coil 12 is within the well formed by the window 32.

A pipe 36 extends through the bottom wall 18 of the chamber 14 and is connected to means, such as a vacuum pump, for drawing a vacuum in the chamber 14. A door 38 is in a side wall 20 of the chamber 14 to allow objects to be inserted and removed from the chamber 14. An inlet pipe 39 extends through a side wall 20 of the chamber 14 to allow for the admission of a plasma forming gas. The coil 12 is electrically connected to an RF power supply 40 through a matching network circuit 42. The RF power supply 40 for the coil may be the same as or separate from the RF power supply 24 for the electrode 22.

Figure 3:
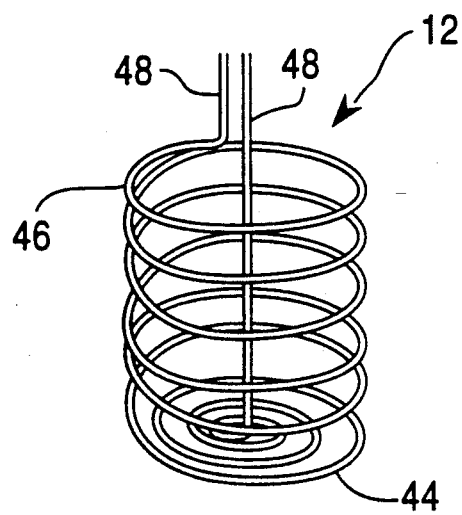
FIG. 3 is a perspective view of a form of the inductive coil of the invention.

In FIG. 3, the coil 12 has a flat or pancake portion 44 and a tubular portion 46 extending substantially perpendicularly from the outer edge of the flat portion 44. The coil 12 is formed of a solid or hollow conductor which is first wound in a spiral to form the flat portion 44 and then wound in the form of a tube to form the tubular portion 46. The tubular portion 46 may be substantially cylindrical or can be conical. As will be explained, the tubular portion 46 is shaped to provide a desired shape of the plasma formed in the chamber 14. A terminal 48 is provided at each end of the coil 12 whereby the coil 12 can be connected to the RF power supply 40. A coil 12 formed of a hollow conductor is preferred to allow cooling of the coil by flowing a cooling liquid therethrough.

The dimensions and aspect ratio (the ratio of the size of the flat section 44 to the height of the tubular section 46) of the coil 12 can vary depending on the size of the plasma apparatus 10, and in order to shape or modify the plasma profile for a specific purpose. However, for a plasma apparatus which is between about 20 centimeters (cm) and 25 cm in diameter, a typical coil 12 may be formed of 0.6 cm diameter copper tubing with the flat section 44 having between 1 to 3 full turns and an outer diameter of between about 6.3 and 8.9 cm. The tubular portion 24 is a continuation of the last turn of the flat section 22 and thus has a diameter of between about 6.3 and 8.9 cm. The length or height of the tubular portion can be approximately 8.9 cm.

In the operation of the plasma generating apparatus 10, an object to be treated, such as a semiconductor wafer, is placed in the chamber 14 on the table 28. The chamber 14 is the evacuated to a desired vacuum. A suitable gas is then admitted to the chamber 14. The power to the coil 12 and the electrode 22 is turned on to create a field across the gas in the chamber 14. This results in the formation of a plasma in the chamber.

Figure 4:
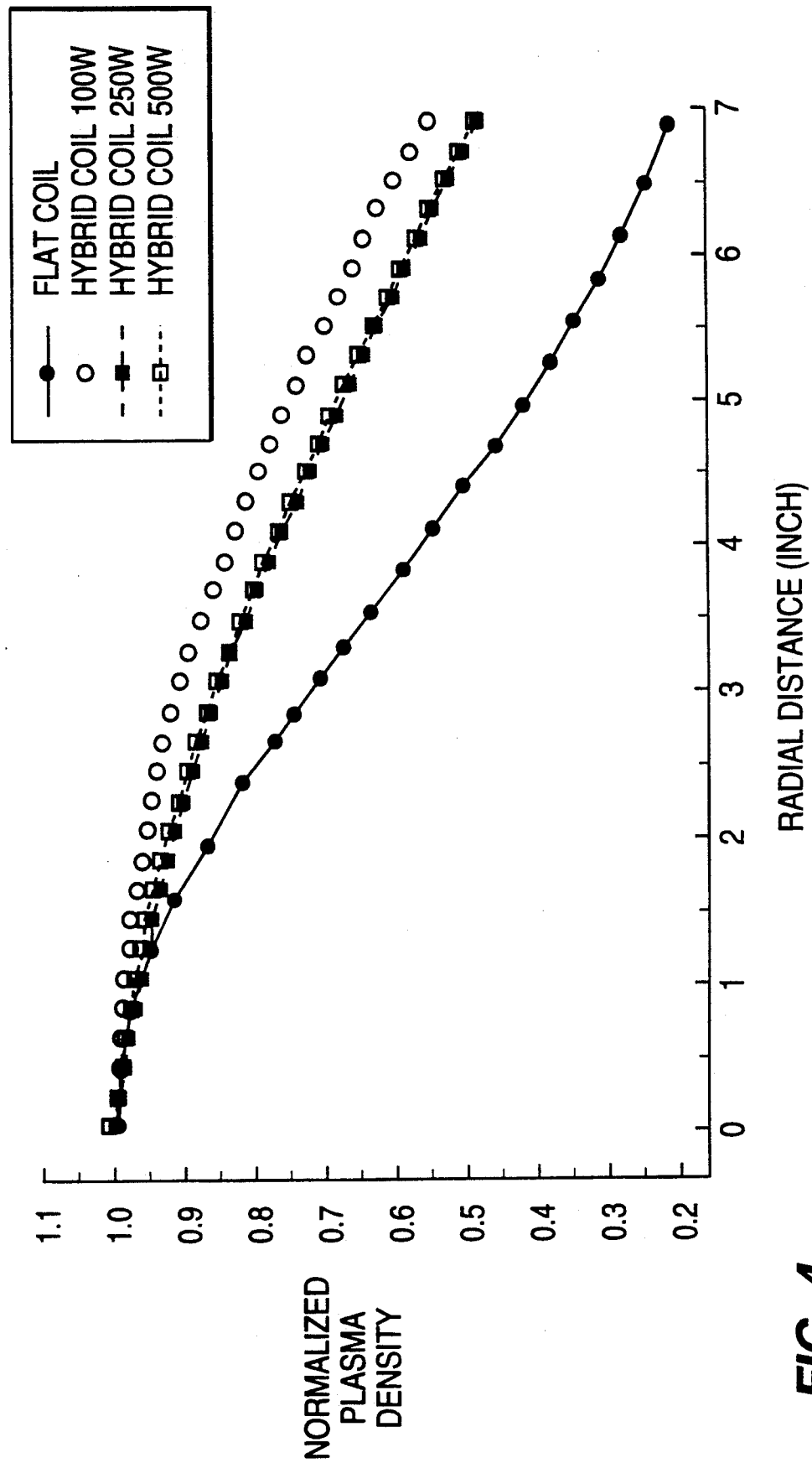
FIG. 4 is a graph showing the density of a plasma across a vacuum chamber for a flat coil and the coil of the invention.

The coil 12 of the invention has a number of advantages over the flat coil heretofore used. The coil 12 has a greater inductive component than the flat coil and therefore generates a greater ion density. The coil 12 permits a lower pressure of operation than the flat coil. The coil 12 will produce a more intense plasma for the same RF power resulting in greater gas and electrical (ionization) efficiencies. Also, the coil 12 provides for greater ease of plasma ignition. Since the coil 12 provides a greater inductive component, the window 32 can be made of a conductive material or of an insulating material coated on its outer surface with a conductive material. A conductive material is less subject to being etched by the plasma in the chamber 14. Thus, a window formed of a conductive material or having a conductive coating on its outer surface which is subjected to the plasma, is less subjected to being etched and therefore has a longer life. However, the most important advantage of the coil 12 of the invention is that it provides a more uniform plasma density profile across the chamber 14. Referring to FIG. 4, there is shown a graph of the plasma density across one-half of a chamber 14. The distance starts with 0 being directly under the coil. It should be understood that a similar density curve is obtained across the other half of the chamber 14. The curve having the solid dots is for a flat coil. The other three curves are for the coil 14 of the invention (indicated as a hybrid coil) at different power levels. It can be seen from FIG. 4 that the curves for the coil 14 of the invention is much flatter than the curve for the flat coil. This shows a more uniform density across the chamber 14. The shape of the tubular portion 46 of the coil 14 can be varied to alter the plasma density profile. Thus, the plasma density profile can be made more uniform by varying the tubular portion 46 between cylindrical and conical.

Figure 5:
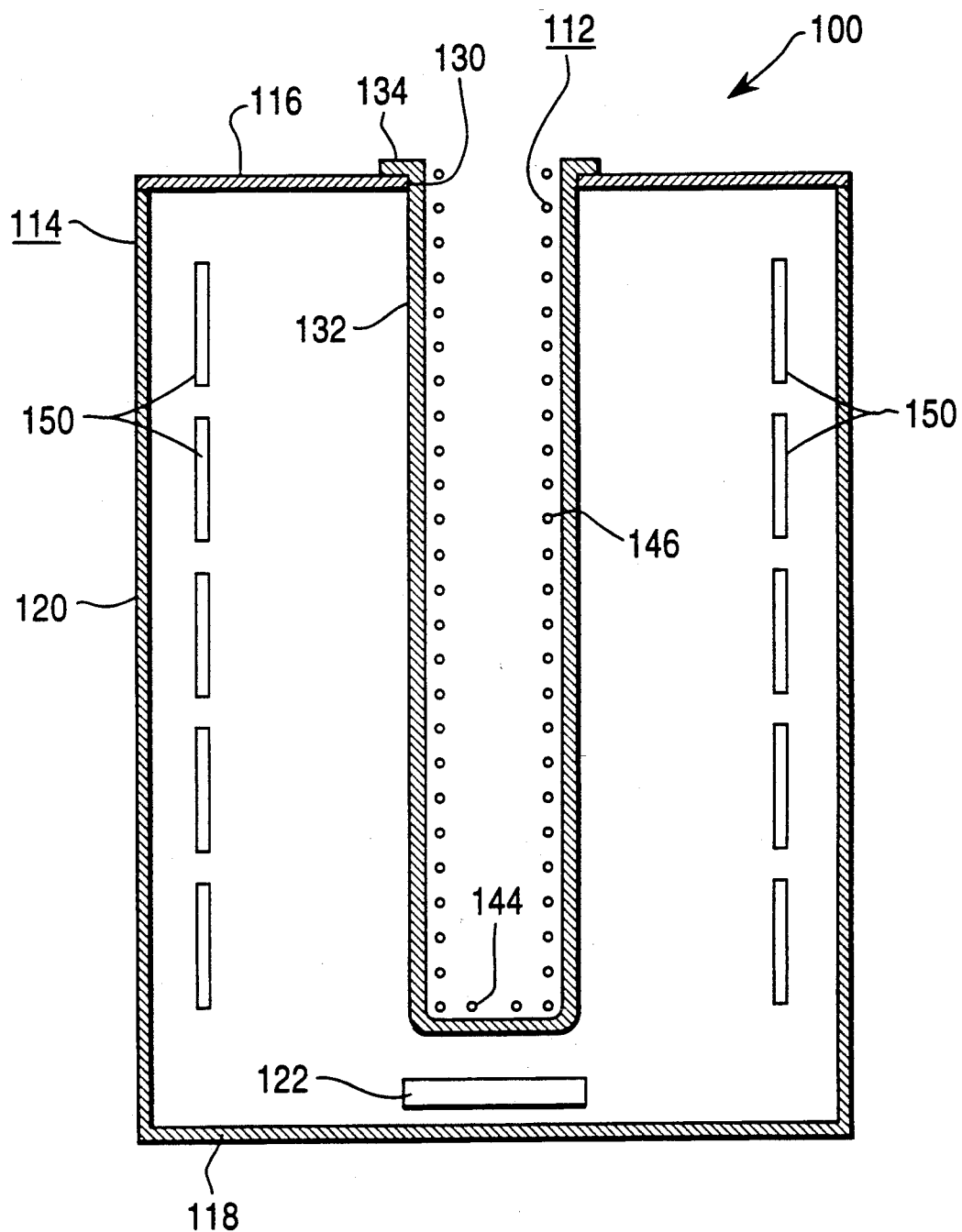
FIG. 5 is a schematic view of another form of a plasma generating apparatus having the induction coil of the invention.

In FIG. 5, there is shown another form of a plasma generating apparatus 100 having the induction coil 112 of the invention. Plasma generating apparatus 100 comprises a chamber 114 having end walls 116 and 118 and side walls 120. Within the chamber 114 and adjacent an end wall 118 is an electrode 122. The electrode is electrically connected to an RF power supply, not shown, similar to the power supply 24 of FIG. 1. An elongated cup-shaped window 132 extends through an opening 130 in the end wall 116 and across substantially the full length of the chamber 114. The window 132 has a rim 134 around its open edge which seats on and is hermetically sealed to the end wall 116. The window 132, like the window 32 of the apparatus 10 of FIG. 1, may be of an insulating material, a conductive material or an insulating material coated on its outer surface with a layer of a conductive material.

The coil 112 is in the window 132. The coil 112, like the coil 12, has a flat or pancake portion 144 and a tubular portion 146. The only difference between the coil 112 and the coil 12 is that the tubular portion 146 of the coil 112 is much longer than the tubular portion 46 of the coil 12. Thus, the coil 112 extends completely along the window 132 with the flat portion 144 being at the closed end of the window 132. This provides the coil 112 along the entire length of the chamber 114. Although not shown, the coil 112 has terminals which are electrically connected to a RF power supply, such as the power supply 40 of FIG. 1.

Although not shown, the chamber 114 has a pipe which is connected to means, such as a vacuum pump, for drawing a vacuum in the chamber, 114, a door by which articles to be treated can be placed in and removed from the chamber 114, and an inlet pipe to allow for the admission of a plasma forming gas. In the chamber 114, the articles 150 to be treated, such as semiconductor wafers, are mounted in the chamber 114 around the window 132. This allows for a larger number of the objects to be treated at one time. The apparatus 100 operates in the same manner as the apparatus 10 of FIG. 1 except that it permits a greater number of articles to be treated at one time. Although the chamber 114 is shown as being vertical, it can also be in a horizontal position.

Thus, there is provided by the invention an inductive coil 14 having a flat portion 44 and a tubular portion 46 extending from the flat portion. When this coil is used in a plasma generating apparatus 10, it produces greater inductive component than a flat coil and amore uniform plasma density profile across the chamber 14 of the apparatus 10. If desired, a magnet system may be used in the chamber 14 to make the plasma density profile more uniform. However, the coil 14 of the invention does not necessarily need such a magnet. Also, although the coil 14 has been described as being preferably used in a plasma generating apparatus, it can be used in other devices, such as electrodeless high efficient lamps.

What is claimed is:

1. An induction coil comprising a flat coil portion having a plurality of turns and a tubular coil portion extending from the outer edge of the flat coil portion, the axis of the tubular coil portion being substantially perpendicular to the flat coil portion.

2. The coil of claim 1 wherein the coil is of a conductor material wound in a flat spiral to form the flat coil portion and in a tubular spiral to form the tubular coil portion.

3. The coil of claim 2 in which the coil is of a solid conductive material.

4. The coil of claim 2 in which the coil is of a hollow tube.

5. The coil of claim 2 in which the tubular coil portion is cylindrical.

6. The coil of claim 2 in which the tubular coil portion is conical.

7. The coil of claim 2 in which the coil has a pair of ends and terminals are connected to the ends of the coil.

8. A plasma production apparatus comprising:
   a chamber having walls and adapted to be placed under a vacuum;
   an electrode in the chamber;
   a cup-shaped window extending into the chamber through one of the walls; and
   an induction coil in the well formed by the window, said coil having a flat coil portion with a plurality of turns at the bottom of the well and a tubular portion extending from the flat portion.

9. The apparatus of claim 8 in which the induction coil is of a conductor material wound in a flat spiral to form the flat portion and then in a tubular spiral to form the tubular portion.

10. The apparatus of claim 9 in which the induction coil is of a solid conductive material.

11. The apparatus of claim 9 in which the induction coil is of a hollow tube.

12. The apparatus of claim 9 in which the tubular portion of the induction coil is cylindrical.

13. The apparatus of claim 9 in which the tubular portion of the induction coil is conical.

14. The apparatus of claim 9 in which the induction coil has a pair of ends and a terminal is attached to each end of the coil.

15. The apparatus of claim 8 in which the window is of a conductive material.

16. The apparatus of claim 8 in which the window is of an insulating material and is coated on its outer surface with a conductive material.

* * * * *